(12) United States Patent
Yang et al.

(10) Patent No.: US 11,610,926 B2
(45) Date of Patent: Mar. 21, 2023

(54) IMAGE SENSING DEVICE WITH STRUCTURAL REINFORCEMENT LAYER

(71) Applicant: SK hynix Inc., Icheon-si (KR)

(72) Inventors: Yun Hui Yang, Icheon-si (KR); Tae Gyu Park, Icheon-si (KR); Dong Bin Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 158 days.

(21) Appl. No.: 17/228,329

(22) Filed: Apr. 12, 2021

(65) Prior Publication Data

US 2022/0013564 A1 Jan. 13, 2022

(30) Foreign Application Priority Data

Jul. 10, 2020 (KR) .......................... 10-2020-0085538

(51) Int. Cl.
*H01L 27/146* (2006.01)

(52) U.S. Cl.
CPC .. *H01L 27/14627* (2013.01); *H01L 27/14621* (2013.01); *H01L 27/14623* (2013.01); *H01L 27/14645* (2013.01); *H01L 27/14685* (2013.01)

(58) Field of Classification Search
CPC ........... H01L 27/14605; H01L 27/1462; H01L 27/14621; H01L 27/14623; H01L 27/14627; H01L 27/14645; H01L 27/14685

See application file for complete search history.

(56) References Cited

U.S. PATENT DOCUMENTS

| 2016/0056187 A1* | 2/2016 | Lin ................... H01L 27/14621 257/432 |
| 2018/0358396 A1* | 12/2018 | Huang .............. H01L 27/14627 |
| 2019/0385968 A1* | 12/2019 | Fujimagari ....... H01L 27/14634 |

FOREIGN PATENT DOCUMENTS

| KR | 100505894 B1 | 8/2005 |
| KR | 20100027835 A | 3/2010 |

* cited by examiner

*Primary Examiner* — Nelson Garces
(74) *Attorney, Agent, or Firm* — Perkins Coie LLP

(57) ABSTRACT

An image sensing device that includes a reinforced structure is disclosed. The image sensing device includes a semiconductor substrate structured to include a pixel region including a plurality of unit pixels and a peripheral region located outside the pixel region, a plurality of microlenses disposed over the semiconductor substrate in the pixel region, a structural reinforcement layer disposed over the semiconductor substrate in the peripheral region, and a lens capping layer structured to cover the microlenses and at least of the structural reinforcement layer. The structural reinforcement layer includes a plurality of fingers each finger vertically structured to have a rounded upper end and laterally extend to have a predetermined length toward the pixel region. The fingers are consecutively arranged and connected to each other in a lateral direction, and side surfaces of fingers are in contact with side surfaces of immediately adjacent fingers.

15 Claims, 14 Drawing Sheets

IMAGE SENSING DEVICE WITH STRUCTURAL REINFORCEMENT LAYER

CROSS-REFERENCE TO RELATED APPLICATION

This patent document claims the priority and benefits of Korean patent application No. 10-2020-0085538, filed on Jul. 10, 2020, which is incorporated by reference in its entirety as part of the disclosure of this patent document.

TECHNICAL FIELD

The technology and implementations disclosed in this patent document generally relate to an image sensing device.

BACKGROUND

An image sensor is used in electronic devices to convert optical images into electrical signals. With the recent development of automotive, medical, computer and communication industries, the demand for highly integrated, higher-performance image sensors has been increasing in various devices, for example, digital cameras, camcorders, personal communication systems (PCSs), video game consoles, surveillance cameras, medical micro-cameras, robots, etc.

SUMMARY

The embodiments of the disclosed technology relate to an image sensing device including a lens capping layer that is not easily peeled off, preventing the flare phenomenon that would have occurred in a lens layer if the lens capping layer had been peeled off.

In some embodiments of the disclosed technology, an image sensing device includes a reinforced structure to prevent damage to a light shielding layer located at a lower portion of a lens layer even in a situation where a lens layer is damaged during an etching process for patterning a lens capping layer.

In an embodiment of the disclosed technology, an image sensing device may include a semiconductor substrate structured to include a pixel region, which includes a plurality of unit pixels, and a peripheral region located outside the pixel region, a plurality of microlenses disposed over the semiconductor substrate in the pixel region, a structural reinforcement layer disposed over the semiconductor substrate in the peripheral region, and a lens capping layer structured to cover the microlenses and at least part of the structural reinforcement layer. The structural reinforcement layer may include a plurality of fingers each finger vertically structured to have a rounded upper end and laterally extend to have a predetermined length toward the pixel region. The plurality of fingers may be consecutively arranged and connected to each other in a lateral direction, and side surfaces of fingers are in contact with side surfaces of immediately fingers.

In another embodiment of the disclosed technology, an image sensing device may include a planarization layer formed over a lower structure including sensor pixels structured to detect incident light to output electrical signals indicative of an image of the incident light, a plurality of microlenses disposed over the planarization layer to converge incident light onto the sensor pixels, a structural reinforcement layer disposed over the planarization layer to surround the microlenses, and a lens capping layer disposed over the microlenses and the structural reinforcement layer. The structural reinforcement layer may include a plurality of fingers, each of which has a body portion that has a curvature in a short-axis direction and extends to a predetermined length without a curvature in a long-axis direction perpendicular to the short-axis direction. The plurality of fingers may be consecutively arranged adjacent to each other.

In another embodiment of the disclosed technology, an image sensing device may include an image sensing device may include a semiconductor substrate structured to include a pixel region, which has a plurality of unit pixels, and a peripheral region located outside the pixel region, a plurality of microlenses disposed over the semiconductor substrate in the pixel region, an anti-peel-off structure disposed over the semiconductor substrate in the peripheral region, and a lens capping layer structured to cover all of the microlenses and to cover some regions of the anti-peel-off structure. The anti-peel-off structure may include a plurality of fingers configured in a manner that an upper line of each finger in a vertical cross-section of the short-axis direction is rounded to have a curvature, and the vertical cross-sectional structure of each finger extends to a predetermined length in a long-axis direction perpendicular to the short-axis direction. The plurality of fingers may be consecutively coupled to each other in a manner that side surfaces of adjacent fingers from among the plurality of fingers are in contact with each other.

In another embodiment of the disclosed technology, an image sensing device may include an image sensing device may include a planarization layer formed over a lower structure to remove a step difference caused by the lower structure, a plurality of microlenses disposed over the planarization layer to converge incident light, an anti-peel-off structure disposed over the planarization layer to surround the microlenses, and a lens capping layer disposed over the microlenses and the anti-peel-off structure. The anti-peel-off structure may include a plurality of fingers, each of which has a body portion that has a curvature in a short-axis direction and extends to a predetermined length without a curvature in a long-axis direction perpendicular to the short-axis direction. The plurality of fingers may be consecutively arranged adjacent to each other.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of an image sensing device. Some implementations of the disclosed technology suggest designs of an image sensing device that can prevent a lens capping layer from being easily peeled off, preventing the flare phenomenon that would have occurred in a lens layer if the lens capping layer had been peeled off. The disclosed technology can be implemented in some embodiments to provide an image sensing device that includes a reinforced structure to prevent damage to a light shielding layer located at a lower part of a lens layer even in a situation where a lens layer is damaged during an etching process for patterning a lens capping layer.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
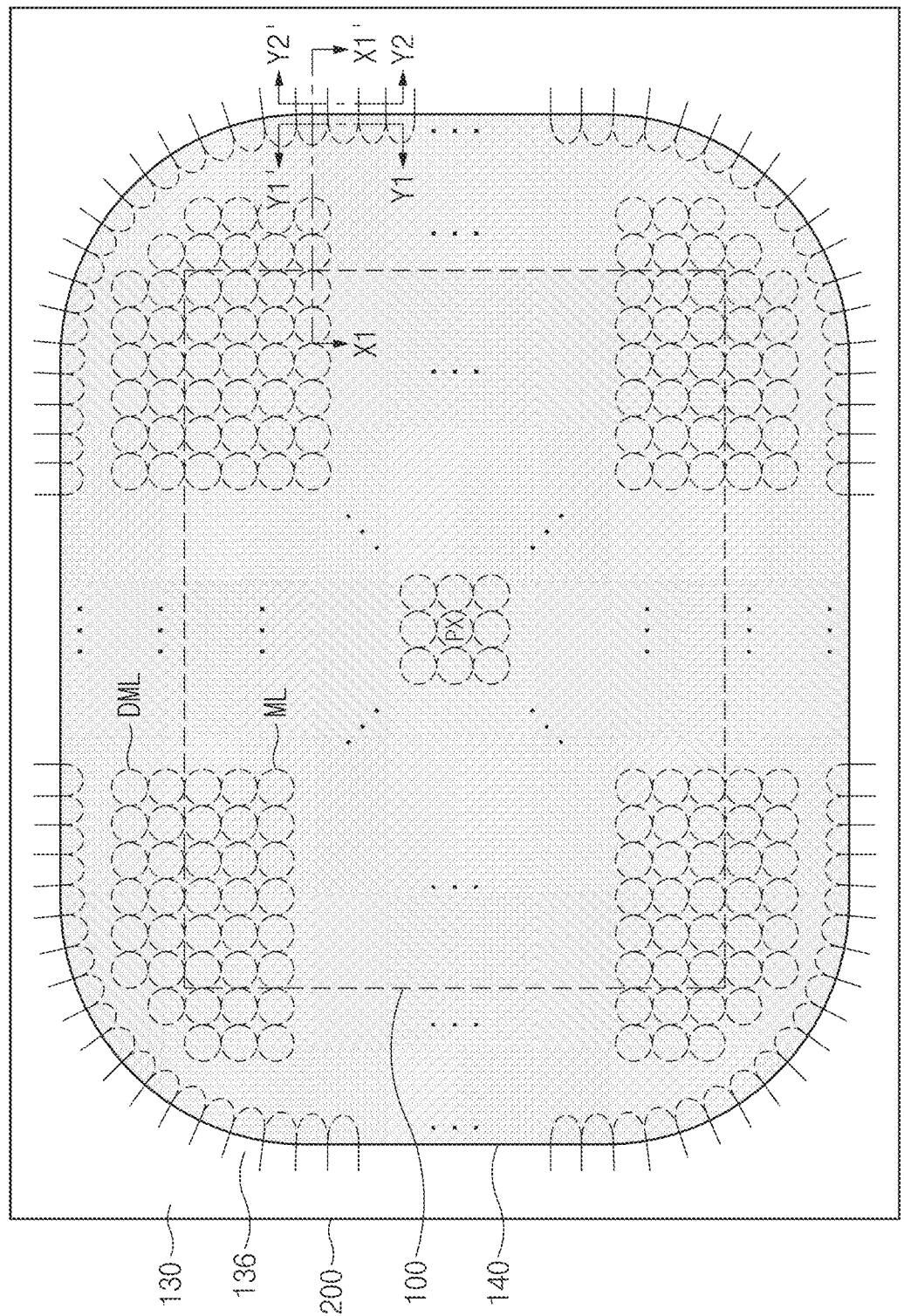
FIG. 1 is a schematic diagram illustrating an example layout of an image sensing device based on some implementations of the disclosed technology.

FIG. 1 is a schematic diagram illustrating an example layout of an image sensing device based on some implementations of the disclosed technology.

Referring to FIG. 1, the image sensing device may include a pixel region 100 and a peripheral region 200.

The pixel region 100 may be located on the image sensing device, and is included at the center of the image sensing device. The pixel region 100 may include a plurality of unit pixels (PXs) arranged in rows and columns in a two-dimensional (2D) matrix array. For example, the plurality of unit pixels (PXs) may be consecutively arranged in a first direction and a second direction perpendicular to the first direction. The plurality of unit pixels (PXs) may include red (R) color filters, green (G) color filters, and blue (B) color filters, which may be arranged in a Bayer pattern. The plurality of unit pixels (PXs) may convert incident light received through the color filters into electrical signals corresponding to the incident light, generating a pixel signal using the electrical signals.

The pixel region 100 may include a plurality of microlenses (ML) arranged over the color filters to converge incident light upon a corresponding color filter. In some implementations, each of the microlenses may be arranged over a corresponding unit pixel (PX). A lens capping layer 140 may be disposed over the microlenses (ML) to protect microlenses (ML) while preventing the flare phenomenon associated with the microlenses (ML). The lens capping layer 140 may be formed to cover all of the pixel region 100 and extend to the peripheral region 200. The lens capping layer 140 may include a low temperature oxide (LTO) film.

The peripheral region 200 may be located outside the pixel region 100. The peripheral region 200 may be formed to surround the pixel region 100. The peripheral region 200 may include a light shielding layer structured to shield a semiconductor substrate from light which would otherwise be incident thereon. The light shielding layer may be disposed between the semiconductor substrate and the lens layer 130. The peripheral region 200 may include an optical black pixel (OBP) region to generate a pixel signal in a dark state. For example, the optical black pixels refer to pixels that are shielded from light that is incident upon an image sensor. The peripheral region 200 may include a logic circuit region that includes logic gates configured to, for example, receive pixel signals generated by the unit pixels (PXs) and process the received pixel signals. If the image sensing device is formed by stacking a plurality of semiconductor layers or substrates, the logic region may be disposed below the pixel region 100 as necessary. In addition, the peripheral region 200 may include a pad region as necessary.

In some implementations, the peripheral region 200 may include microlenses that are continuously arranged from the pixel region 100. In some implementations, the microlenses arranged in the peripheral region 200 have the same structure as the microlenses (ML) in the pixel region 100. In some implementations, the microlenses arranged in the peripheral region 200 may include extra microlenses that do not perform the function of the microlenses (ML) in the pixel region 100. In this regard, each of the microlenses formed in the peripheral region 200 may be referred to as a dummy or extra microlens (DML).

In some implementations of the disclosed technology, the peripheral region 200 may include a reinforced structure to prevent damage to a light shielding layer. In one example, the peripheral region 200 may include a three-dimensional (3D) structural reinforcement layer or anti-peel-off structure 136 to provide a structural reinforcement at the light shielding layer, preventing damage to the light shielding layer while preventing the lens capping layer 140 from being peeled off. In some implementations, the anti-peel-off structure 136 may be formed in an annular shape surrounding the microlenses ML and DML. For example, the anti-peel-off structure 136 may include a plurality of finger-shaped structures. In a vertical cross-section of a short-axis direction of each finger-shaped structure contained in the anti-peel-off structure 136, an upper end of the finger-shaped structure may be rounded to have a curvature as in the microlens, and the rounded upper end may extend to a predetermined length in a long-axis direction. The anti-peel-off structure 136 may include the finger-shaped structures consecutively arranged and connected each other such that side surfaces thereof are in contact with each other, forming an annular shape that surrounds the microlenses ML and DML. In this patent document, the word "finger" can be used to indicate the finger-shaped structures in the anti-peel-off structure 136.

The anti-peel-off structure 136 may be formed in the lens layer 130. In some implementations, the anti-peel-off structure 136 may be formed in the peripheral region 200. In the lens layer 130, the anti-peel-off structure 136 may be formed at an edge region of the lens capping layer 140.

Figure 2:
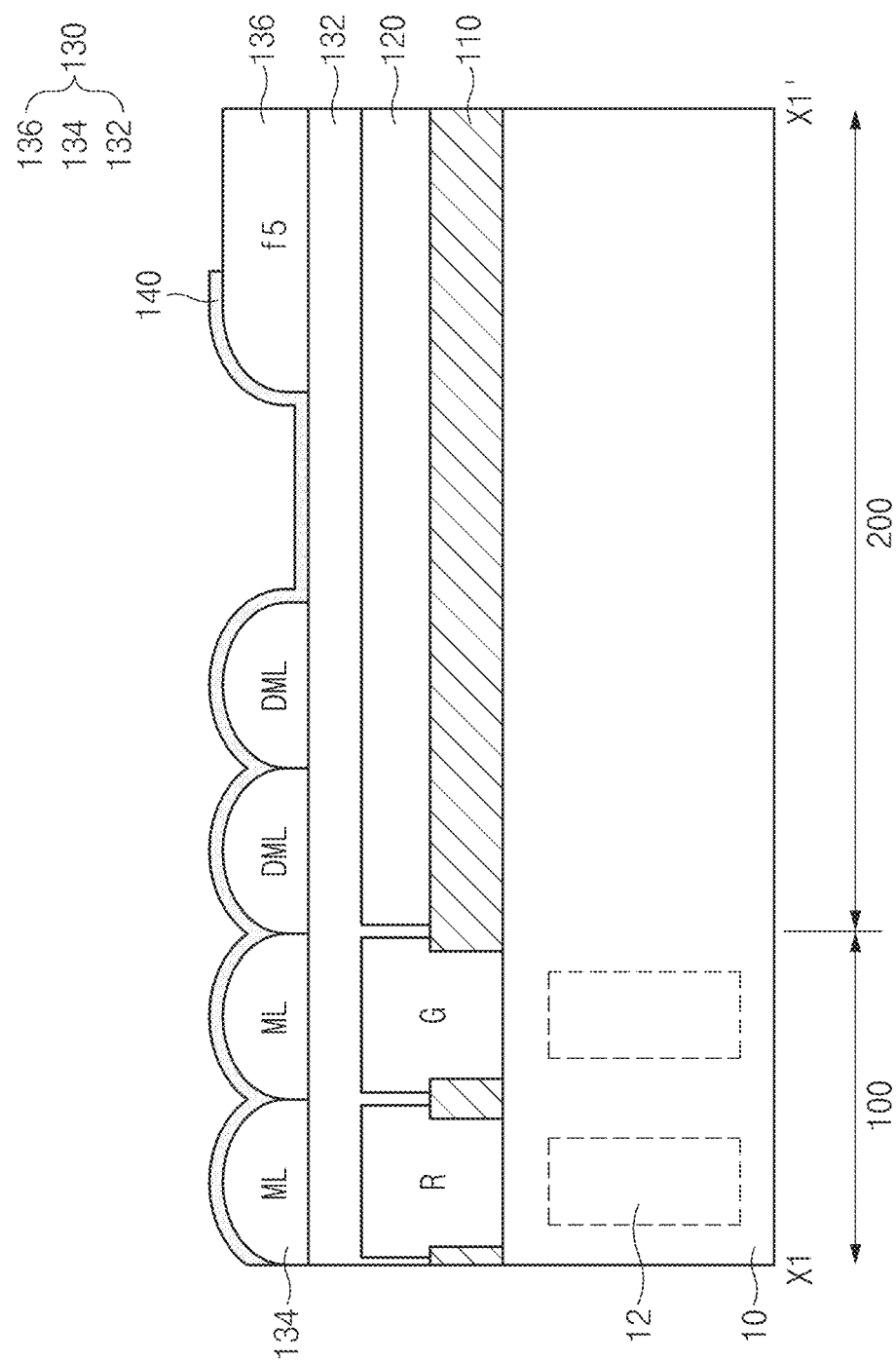
FIG. 2 is a cross-sectional view illustrating an example of the image sensing device taken along the line X1-X1' shown in FIG. 1 based on some implementations of the disclosed technology.
Figure 3A:
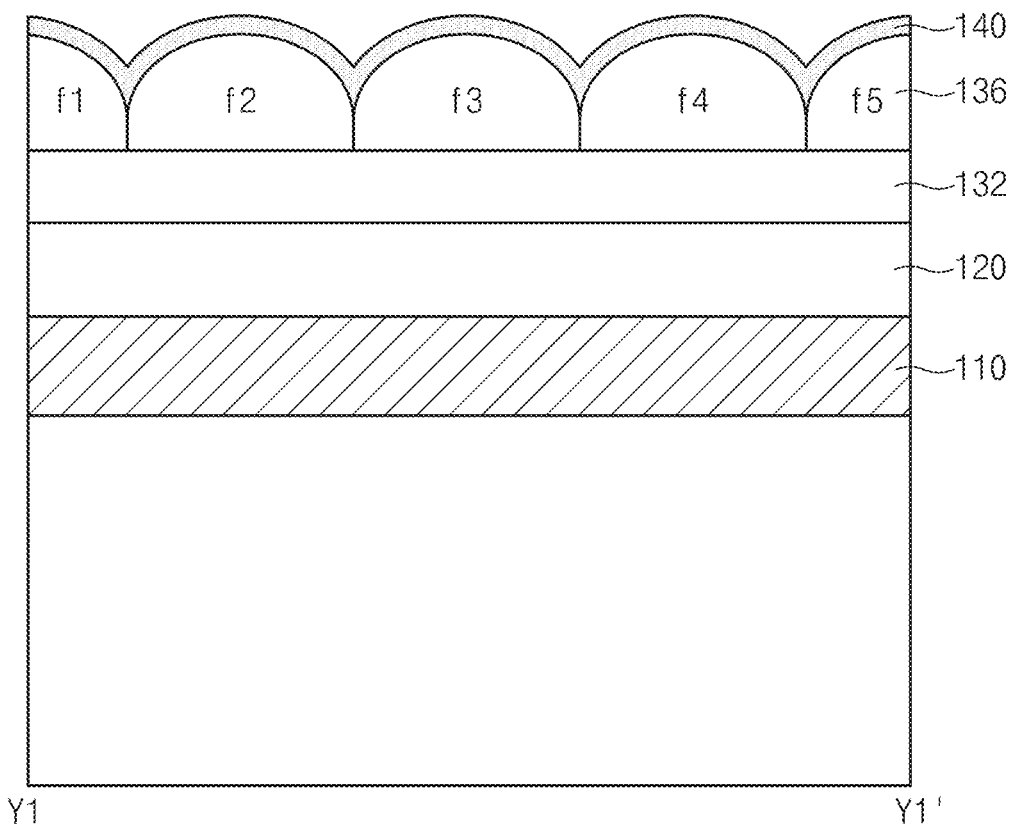
FIG. 3A is a cross-sectional view illustrating an example of the image sensing device taken along the line Y1-Y1' shown in FIG. 1 based on some implementations of the disclosed technology.
Figure 3B:
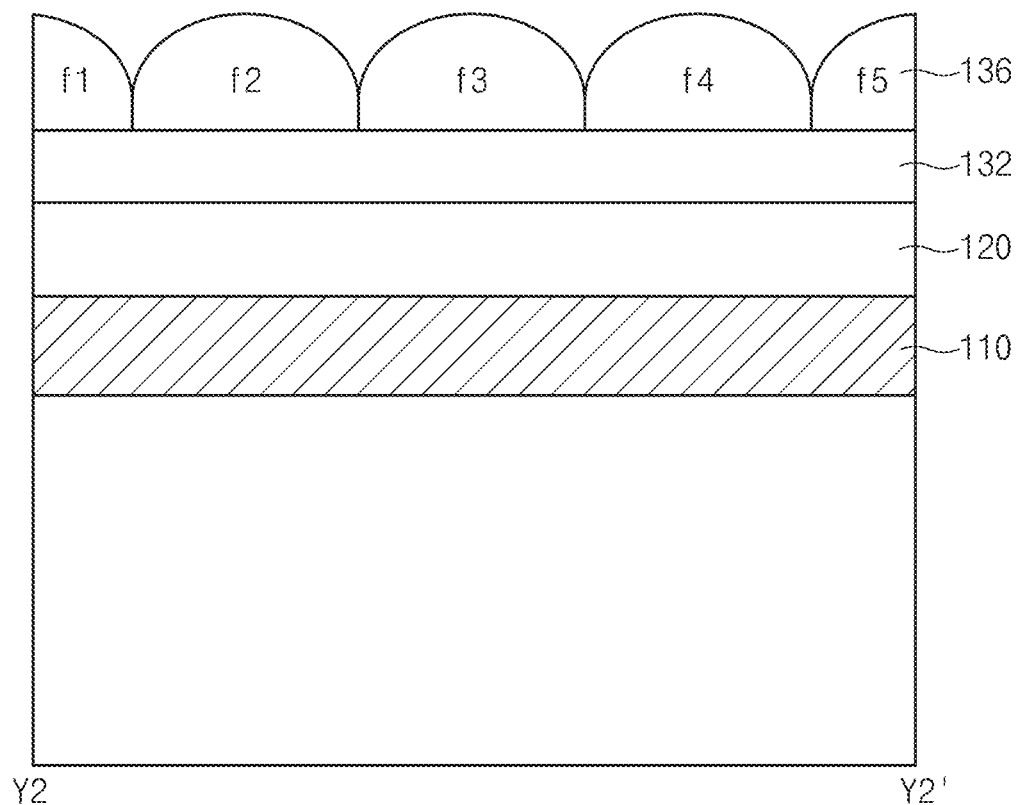
FIG. 3B is a cross-sectional view illustrating an example of the image sensing device taken along the line Y2-Y2' shown in FIG. 1 based on some implementations of the disclosed technology.

FIG. 2 is a cross-sectional view illustrating an example of the image sensing device taken along the line X1-X1' shown in FIG. 1 based on some implementations of the disclosed technology. FIG. 3A is a cross-sectional view illustrating an example of the image sensing device taken along the line Y1-Y1' shown in FIG. 1 based on some implementations of the disclosed technology. FIG. 3B is a cross-sectional view illustrating an example of the image sensing device taken along the line Y2-Y2' shown in FIG. 1 based on some implementations of the disclosed technology.

The semiconductor substrate 10 may include a first surface and a second surface facing away from each other. The semiconductor substrate 10 may include a monocrystalline material. In some implementations, the semiconductor substrate 10 may include silicon and/or a silicon-containing material. The semiconductor substrate 10 may include the pixel region 100 and the peripheral region 200. The pixel region 100 may include a plurality of photoelectric conversion elements 12 corresponding to the respective unit pixels (PXs). The photoelectric conversion elements 12 may convert incident light into electrical signals by performing photoelectric conversion of the incident light. Each of the photoelectric conversion elements 12 may include a photodiode.

A light shielding layer 110, a color filter layer 120, and a lens layer 130 may be sequentially formed over the first surface of the semiconductor substrate 10.

The light shielding layer 110 may include a material layer structured to block incident light. For example, the light shielding layer 110 may include a metal layer such as tungsten (W). In the pixel region 100, the light shielding layer 110 may be formed in a grid shape that includes rows and columns arranged between adjacent color filters R, G, and B, thereby preventing crosstalk between the adjacent color filters. In the peripheral region 200, the light shielding layer 110 may be formed to cover all of the peripheral region 200, thereby shielding the semiconductor substrate 10 of the peripheral region 200 from light that would otherwise be incident thereon.

The color filter layer 120 may be formed in the pixel region 100 and the peripheral region 200. In the pixel region 100, the color filter layer 120 may include the plurality of color filters (e.g., R/G/B filters), each of which is formed to selectively transmit visible light at a certain wavelength while blocking light at other wavelengths. For example, the color filter layer 120 may include a plurality of red color filters (Rs), a plurality of green color filters (Gs), and a plurality of blue color filters (Bs). Each red color filter (R) may transmit only light in red wavelength regions of visible light. Each green color filter (G) may transmit only light in green wavelength regions of visible light. Each blue color filter (B) may transmit only light in blue wavelength regions of visible light. The color filters (e.g., RGB filters) may be formed per unit pixel (PX). The red color filters (Rs), the green color filters (Gs), and the blue color filters (Bs) may be arranged in a Bayer pattern. In the peripheral region 200, the color filter layer 120 may be formed in a manner that one of the RGB color filters entirely covers the light shielding layer 110.

The color filter layer 120 may include an organic polymer material including a red pigment, a green pigment, or a blue pigment. In some implementations, the color filter layer 120 may include a photoresist material.

The lens layer 130 may be formed over the color filter layer 120 in the pixel region 100. In some implementations, the lens layer 130 may also be formed over the color filter layer 120 in the peripheral region 200. The lens layer 130 may include an over-coating layer 132, a plurality of microlenses (ML, DML) 134, and an anti-peel-off structure 136. In some implementations, the over-coating layer 132, the microlenses (ML, DML) 134, and the anti-peel-off structure 136 may be formed of the same materials. In some implementations, the anti-peel-off structure 136 may be formed of materials different from the over-coating layer 132 and the microlenses (ML, DML) 134.

The over-coating layer 132 may be formed over the color filter layer 120 in the pixel region 100 and the peripheral region 200. The over-coating layer 132 may be used as a planarization layer to reduce/minimize height differences caused by the color filter layer 120. The microlenses (ML, DML) 134 and the anti-peel-off structure 136 may be formed over the over-coating layer 132.

In some implementations, each of the microlenses 134 may be formed in a hemispherical shape. In some implementations, the microlenses 134 may be formed in the pixel region 100, and may extend to the peripheral region 200. In the following description, in order to distinguish the microlenses formed in the pixel region 100 from other microlenses formed in the peripheral region 200, the microlenses formed in the peripheral region 200 are referred to as dummy microlenses (DML). The microlenses (ML) may be formed in one-to-one correspondence with the color filters (R, G, B) in the pixel region 100. The microlenses (ML) may converge incident light and transmit the converged light to the color filters of the corresponding unit pixel. The dummy microlenses (DML) formed in the peripheral region 200 may be continuously arranged from the microlenses (ML) in the pixel region 100.

Although FIG. 2 shows that each of the dummy microlenses (DML) is formed to have the same size as each of the microlenses (ML) by way of example, it should be noted that the dummy microlenses (DML) may be different in size from the microlenses (ML).

The anti-peel-off structure 136 may include a plurality of fingers f1-f5. The fingers f1-f5 may be consecutively arranged and coupled to each other such that side surfaces thereof are in contact with each other.

Figure 4:
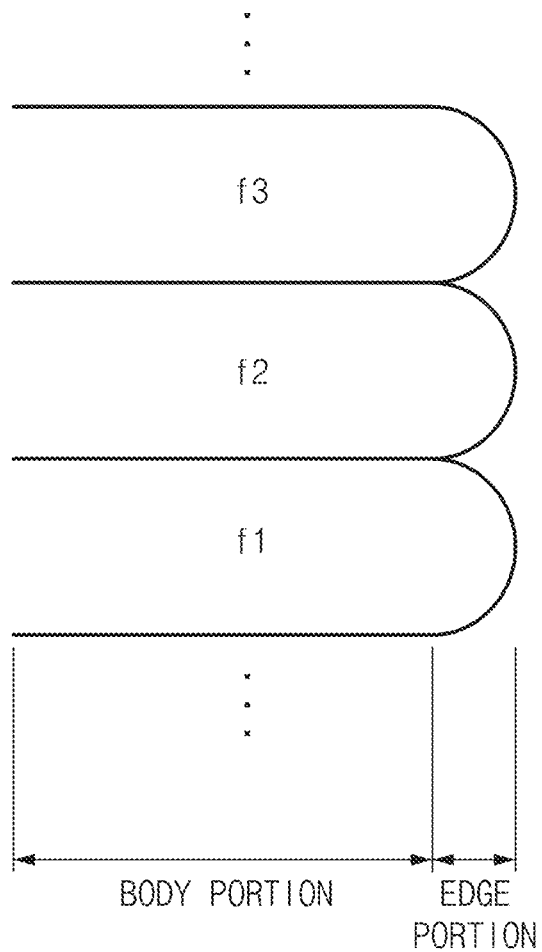
FIG. 4 is a schematic diagram illustrating that regions of each finger in an anti-peel-off structure are classified into a body portion and an edge portion based on some implementations of the disclosed technology.

As shown in FIG. 4, each finger (e.g., f1, f2, f3) may include a body portion and an edge portion. The body portion of each finger may include a region where side surfaces thereof are in contact with side surfaces of adjacent fingers. The edge portion of each finger may include a region protruding from the body portion.

As illustrated in FIG. 2, in some implementations, the body portion of each finger f1-f5 may extend to a predetermined length in a long-axis direction (i.e., a length direction), forming a rectangular shape. For example, the vertical cross-section in the long-axis direction of the body portion of the respective fingers f1-f5 may extend to a predetermined length in the long-axis direction at a predetermined height. In addition, as shown in FIGS. 3A and 3B, the body portion of each finger f1-f5 may have rounded surfaces to have a curvature as in the microlens when viewed from the vertical cross-section in the short-axis direction perpendicular to the length direction. The bottom surface of the body portion of each finger may be in contact with a top surface of the over-coating layer 132.

The edge portion of each finger f1-f5 may be formed to protrude from the body portion in the long-axis direction, and all the side surfaces of the protruding portion may have a curvature as in the microlens.

The fingers f1-f5 may be consecutively coupled to each other such that side surfaces of the body portions of the adjacent fingers are in contact with each other, forming an annular shape that surrounds all of the microlenses 134.

The lens capping layer 140 may be formed over the lens layer 130. In some implementations, the lens capping layer 140 may extend from the pixel region 100 to the anti-peel-off structure 136 of the peripheral region 200. In this case, the lens capping layer 140 may extend to have an end that is disposed over the body portions of the fingers in the anti-peel-off structure 136. For example, the body portions of the adjacent finger f1-f5 are consecutively arranged and connected to each other while being in contact with each other without any empty space (hereinafter referred to as a dead zone) between the body portions of the adjacent fingers f1-f5 in the anti-peel-off structure 136, the edge line of the lens capping layer 140 may be formed over the body portions of the fingers f1-f5.

In some implementations, the anti-peel-off structure 136 includes a three-dimensional (3D) structure that includes the fingers consecutively connected to each other. Since the lens capping layer 140 formed over the consecutively arranged fingers are in contact with the upper surfaces of the fingers over a large area, the lens capping layer 140 can be structurally reinforced and is not easily peeled off from the microlenses 134 and the anti-peel-off structure 136.

Moreover, in some implementations, the fingers f1-f5 do not create a dead zone, and the lens layer 130 corresponding to the edge of the lens capping layer 140 may have a sufficient thickness to prevent potential damage to the light shielding layer 110 disposed at a lower portion of the lens layer 130 during the etching process of the lens capping layer 140. Even if the lens layer 130 of the region corresponding to the edge of the lens capping layer 140 is damaged during the etching process of the lens capping layer 140, the light shielding layer 110 disposed at a lower portion of the lens layer 130 may be protected by the lens layer 130.

Figure 5A:
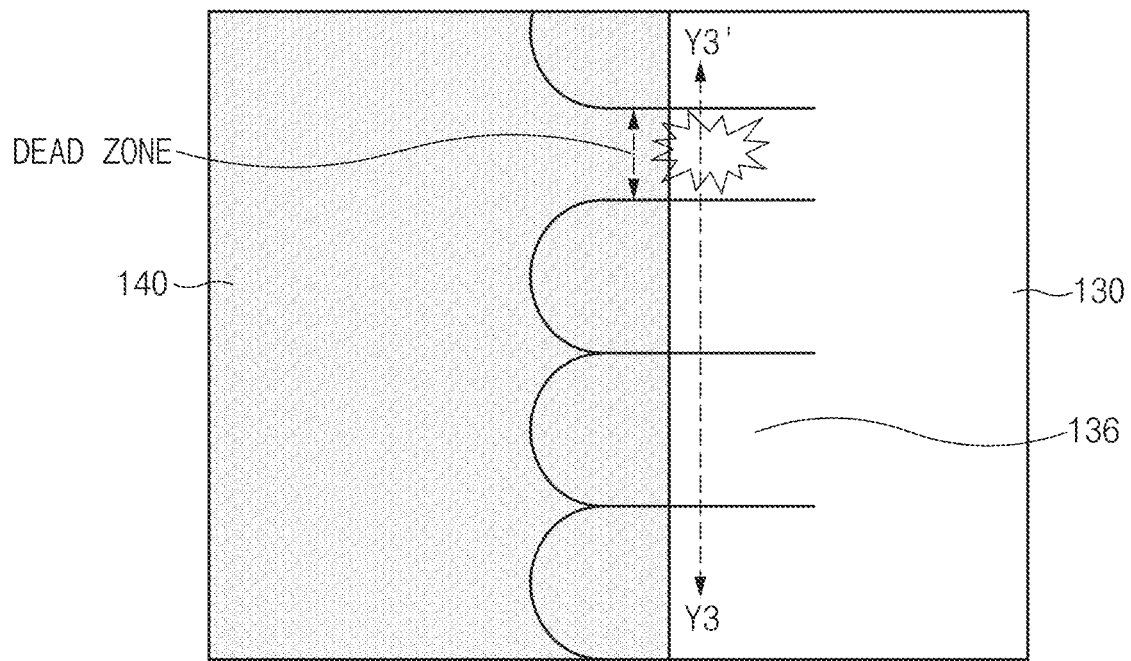
FIG. 5A is a schematic diagram illustrating potential problems that would have occurred when a dead zone is present between fingers of the anti-peel-off structure based on some implementations of the disclosed technology.
Figure 5B:
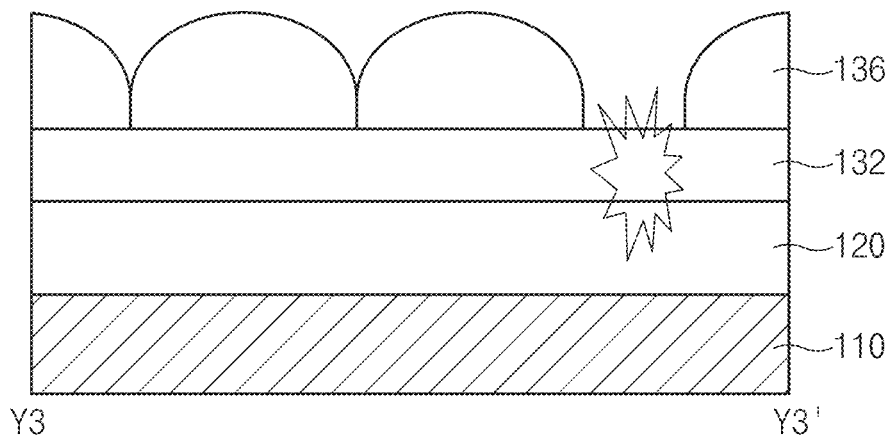
FIG. 5B is a cross-sectional view illustrating an example of the image sensing device taken along the line Y3-Y3' shown in FIG. 5A based on some implementations of the disclosed technology.

FIG. 5A is a schematic diagram illustrating potential problems that would have occurred when a dead zone is present between fingers of the anti-peel-off structure based on some implementations of the disclosed technology. FIG. 5B is a cross-sectional view illustrating an example of the image sensing device taken along the line Y3-Y3' shown in FIG. 5A based on some implementations of the disclosed technology. In FIGS. 5A and 5B, the same reference numerals as those of FIGS. 1 to 3B will be used to refer to the same or like parts for convenience of description.

In general, during a patterning process of the lens capping layer 140, the lens capping layer 140 and the lens layer 130 disposed below the lens capping layer 140 are simultaneously etched in a region (i.e., a region where the edge of the lens capping layer 140 is located) where the lens capping layer 140 is etched.

In this case, as shown in FIGS. 5A and 5B, when a dead zone is present between the fingers, the dead zone has only the over-coating layer 132 of the lens layer 130 and thus may be formed to have a relatively thin thickness. Accordingly, when the lens capping layer 140 is etched, the over-coating layer 132 of the dead zone is also etched, resulting in damage to the color filter layer 120. If material layers formed over the light shielding layer 110 are damaged, the light shielding layer 110 may be corroded by moisture.

Therefore, in some implementations, the adjacent fingers f1-f5 of the anti-peel-off structure 136 are consecutively arranged to be in contact with each other, such that the dead zone is not formed in the region where the edge line of the lens capping layer 140 is located.

Figure 6:
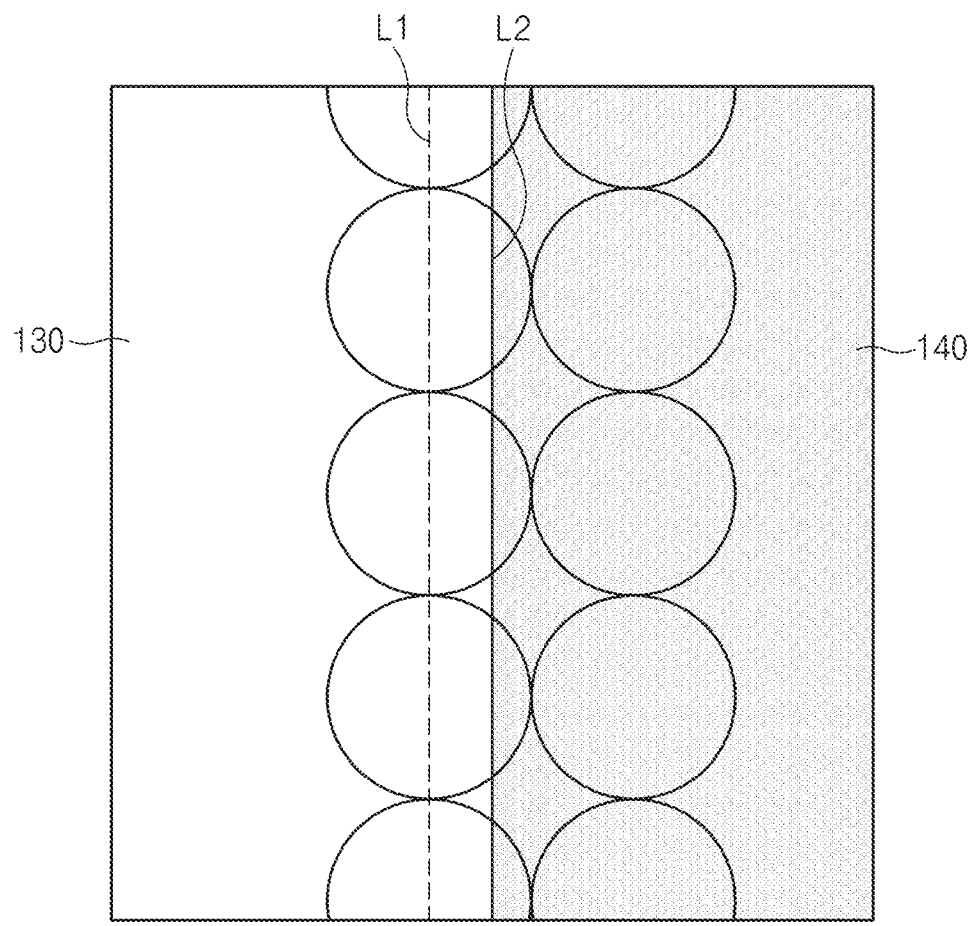
FIG. 6 is a schematic diagram illustrating an example of problems occurring in a situation in which the anti-peel-off structure is formed in a hemispherical shape such as a microlens based on some implementations of the disclosed technology.

FIG. 6 is a schematic diagram illustrating an example of problems occurring in a situation in which the anti-peel-off structure is formed in a hemispherical shape such as a microlens based on some implementations of the disclosed technology.

Referring to FIG. 6, if the anti-peel-off structure is formed in a hemispherical shape, the dead zone is present between the adjacent hemispheres. In order to prevent the edge of the lens capping layer 140 from being located in the dead zone, the edge of the lens capping layer 140 should be located at the center of the hemispheres, as denoted by line L1.

However, it is difficult to locate the edge of the lens capping layer 140 accurately at a desired position. Due to the lack of fabrication process accuracy, as denoted by line L2, the edge of the lens capping layer 140 may be undesirably formed to pass through the dead zone.

Accordingly, in some implementations of the disclosed technology, the body portions of the fingers f1-f5 may be formed to have a sufficient length in the anti-peel-off structure 136. In this way, even if there is a variation in the actual position of the edge of the lens capping layer 140 due to the lack of fabrication process accuracy, the edge of the lens capping layer 140 still remains within the body portions of the fingers f1-f5.

FIGS. 7A to 7D are cross-sectional views illustrating examples of processes for forming the structure shown in FIG. 2 based on some implementations of the disclosed technology.

Figure 7A:
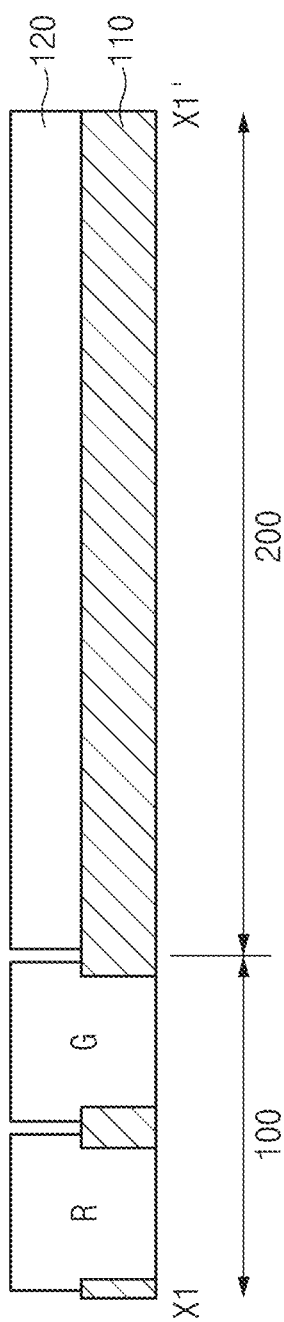
FIGS. 7A to 7D are cross-sectional views illustrating examples of processes for forming the structure shown in FIG. 2 based on some implementations of the disclosed technology.

Referring to FIG. 7A, a metal layer is formed over the semiconductor substrate and is patterned to form the light shielding layer 110. In some implementations, the light shielding layer 110 may be formed in a grid shape that includes rows and columns arranged between adjacent color filters (R, G, B) within the pixel region 100. The light shielding layer 110 may also be formed in the peripheral region 200 to cover the structures in the peripheral region 200. The light shielding layer 110 may include tungsten (W) or may include a stacked structure of barrier metal and tungsten (W).

Subsequently, after a resist (e.g., photoresist) material layer is formed over the light shielding layer 110, an exposure and development process is performed on the resist material layer, forming the color filter layer 120. For example, after the red resist layer is formed in the pixel region 100 and the peripheral region 200, the red resist layer may be exposed and developed in a manner that the red resist layer remains only at a position corresponding to the red color filter based on the Bayer pattern. Subsequently, after the green resist layer is formed in the pixel region 100 and the peripheral region 200 to fill the gap between the red color filters, the green resist layer may be exposed and developed in a manner that the green resist layer remains only at a position corresponding to the green color filter based on the Bayer pattern. As the gap between the red color filter and the green color filter is filled, the blue resist layer is formed in the pixel region 100 and the peripheral region 200. Then, the blue resist layer may be exposed and developed in a manner that the blue resist layer remains only at a position corresponding to the blue color filter based on the Bayer pattern. The color filter layer formed over the light shielding layer may be formed in the peripheral region 200, when one of the red color filter, the green color filter, and the blue color filter is formed.

Figure 7B:
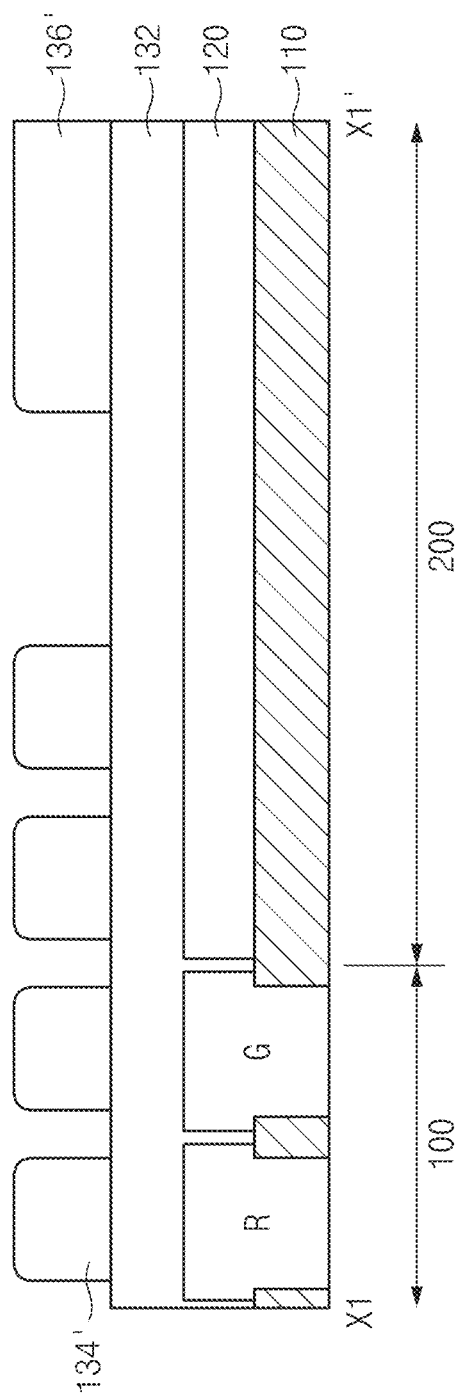

Referring to FIG. 7B, the over-coating layer 132 may be formed over the color filter layer 120 in the pixel region 100 and the peripheral region 200. The over-coating layer 132 may include a polymeric material, for example, a polystyrene-based resin, a polyimide-based resin, a polysiloxane-based resin, an acrylic resin, an epoxy-based resin, or a copolymer resin thereof.

Subsequently, after a material layer for a lens is formed over the over-coating layer 132, the lens-material layer is patterned, resulting in formation of the microlens pattern 134' and the anti-peel-off pattern 136'.

Figure 8:
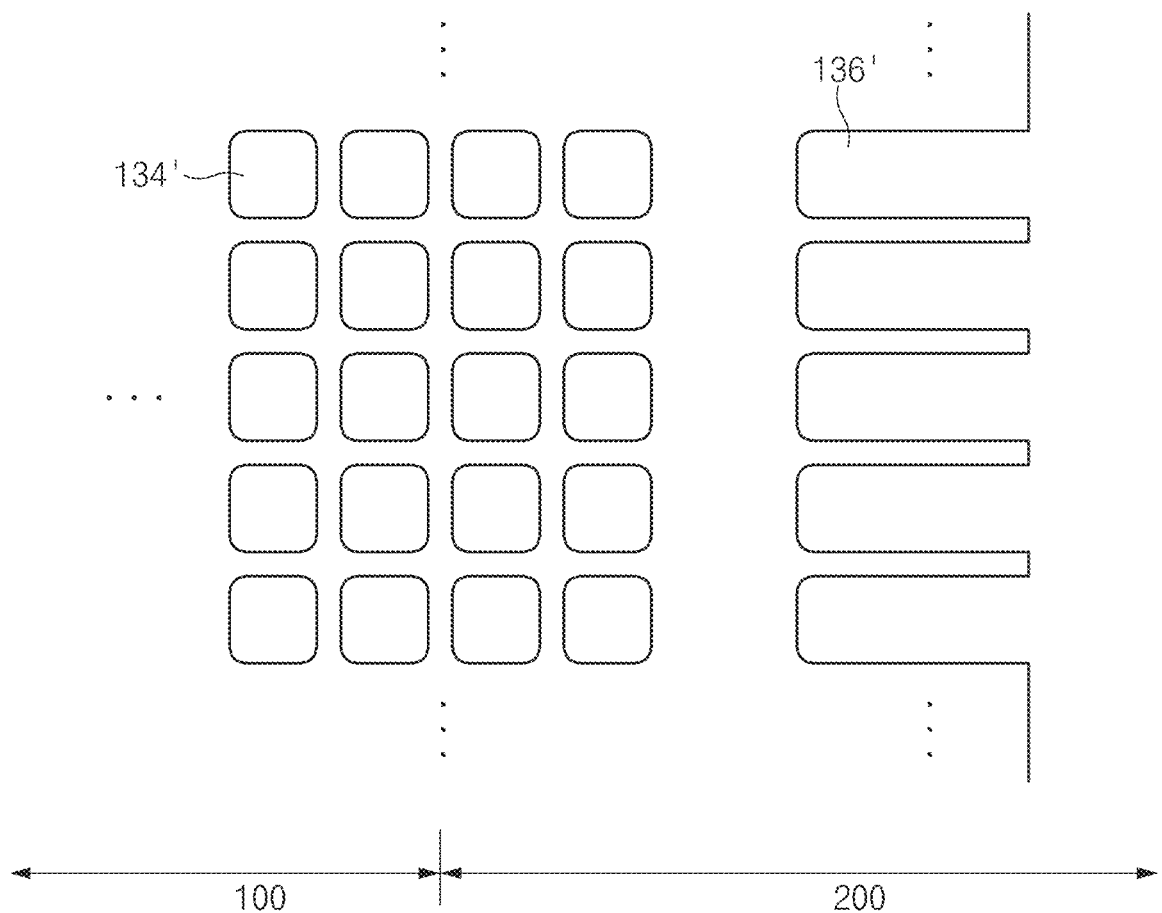
FIG. 8 is a schematic diagram illustrating an example of a microlens pattern and an anti-peel-off pattern that are temporarily formed in a process for forming microlenses and anti-peel-off structures based on some implementations of the disclosed technology.

In this case, as shown in FIG. 8, the microlens pattern 134' may be formed such that a plurality of microlens pattern are spaced apart from each other, and the anti-peel-off pattern 136' may be formed in a line shape protruding toward the pixel region 100 by a predetermined length. The lens-material layer may have the same materials as those of the over-coating layer 132.

Figure 7C:
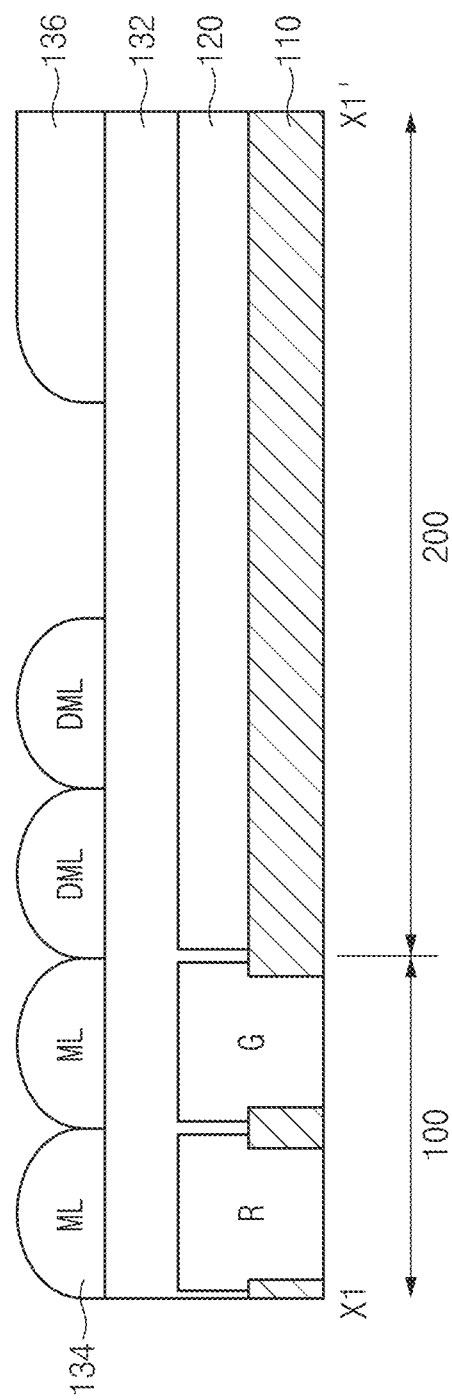

Referring to FIG. 7C, a reflow process is performed on the microlens pattern 134' and the anti-peel-off pattern 136' to form the microlenses ML and DML and the anti-peel-off structure 136. For example, the microlens pattern 134' may be formed in a hemispheric shape having a curvature, resulting in formation of the microlenses ML and DML. In this case, the adjacent microlenses ML and DML may be formed in a manner that side surfaces thereof are in contact with each other. The anti-peel-off pattern 136' may be formed in a finger shape, a top surface of which has a curvature in a short-axis direction. In this case, the side surfaces of the adjacent fingers are in contact with each other, so that a dead zone is not formed between the adjacent fingers.

If a structure in which the side surfaces of the microlenses ML and DML are not in contact with each other and only the side surfaces of the fingers are in contact with each other is desired, a gap between the microlens patterns 134' may be wider than a gap between the anti-peel-off patterns 136'.

Figure 7D:
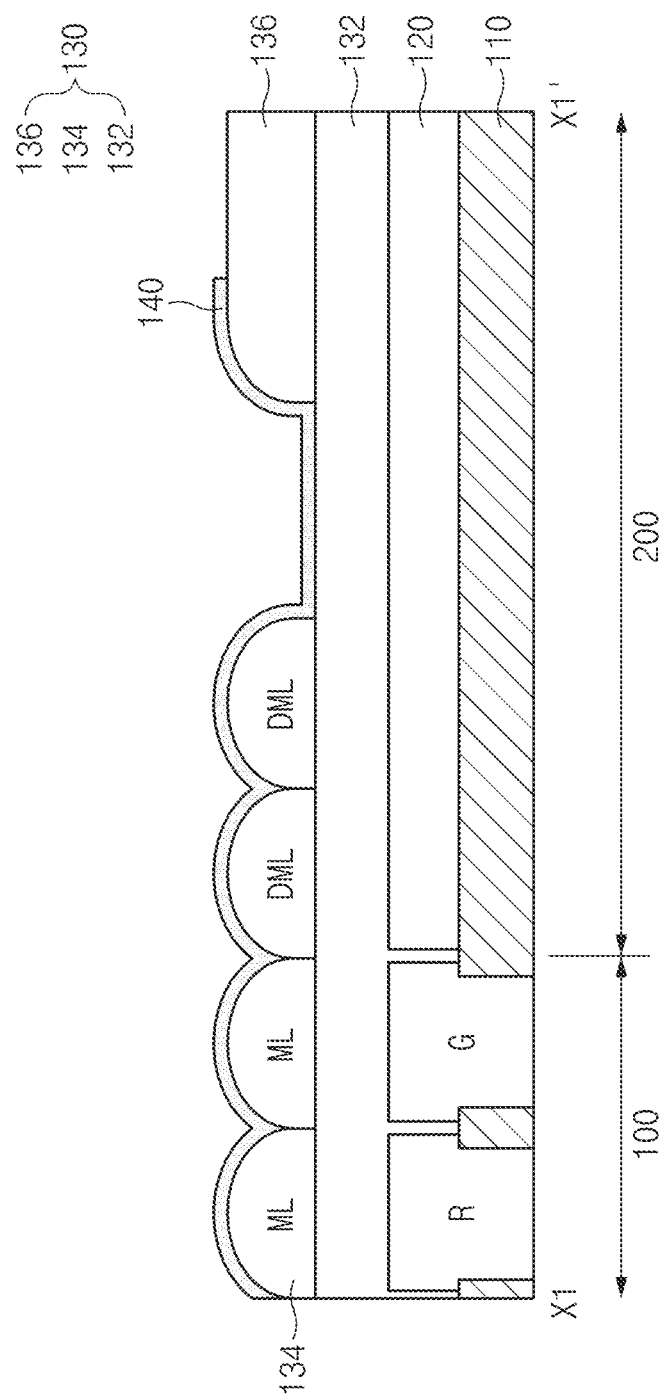

Referring to FIG. 7D, after a low temperature oxide (LTO) film is formed over the lens layer 130 in the pixel region 100 and the peripheral region 200, the low temperature oxide (LTO) film is patterned to form the lens capping layer 140. In this case, the lens capping layer 140 may be patterned in a manner that the edge of the lens capping layer 140 is located at the body portions of the fingers f1-f5 of the anti-peel-off structure 136.

Figure 9:
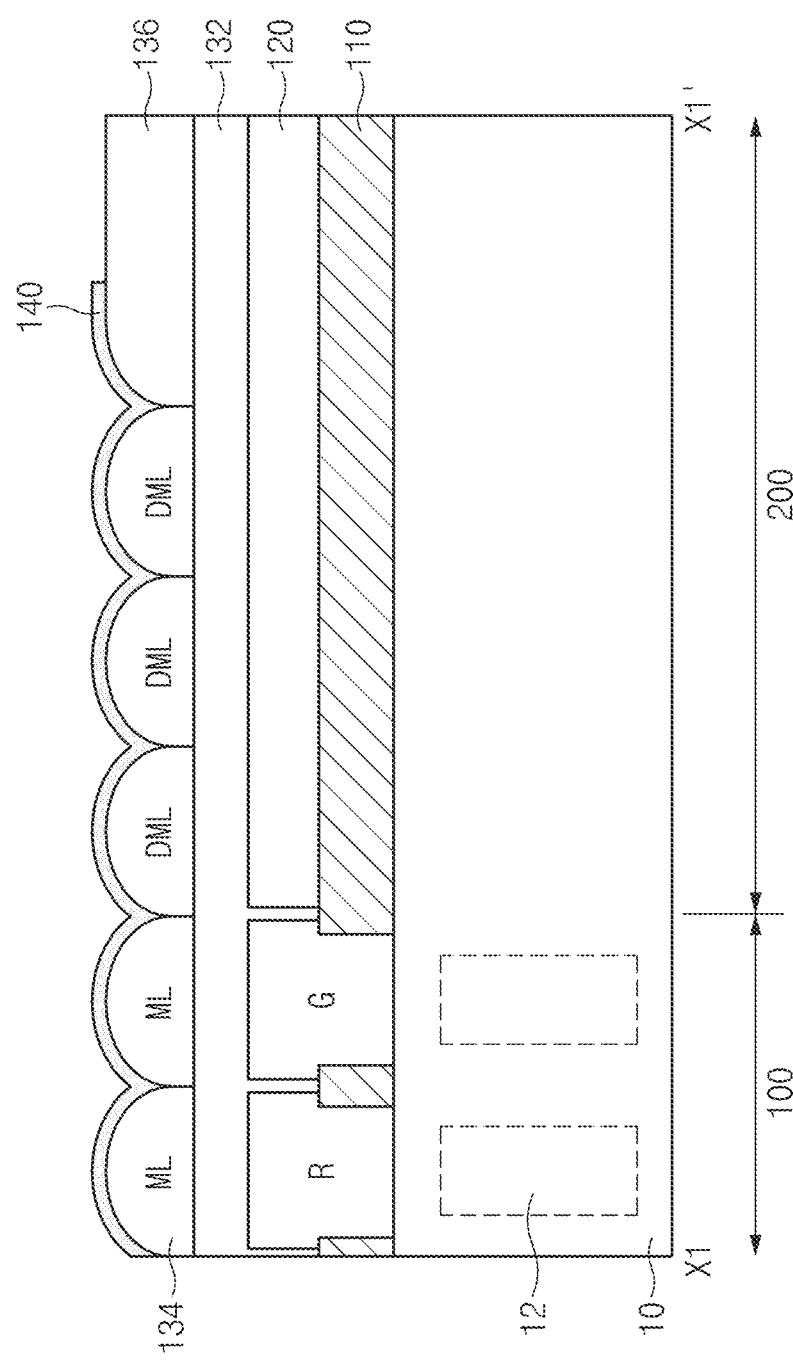
FIG. 9 is a cross-sectional view illustrating an example of an image sensing device based on some other implementations of the disclosed technology.

FIG. 9 is a cross-sectional view illustrating an example of an image sensing device based on some other implementations of the disclosed technology.

Referring to FIG. 9, the dummy microlenses (DML) may extend wider to be connected to the anti-peel-off structure 136.

Unlike the example illustrated in FIG. 2 that the dummy microlenses (DML) are spaced apart by a predetermined distance from the anti-peel-off structure 136 while being in contact with the microlenses (ML), leaving an empty space between the anti-peel-off structure 136 and the dummy microlenses (DML), the dummy microlenses (DML) shown in FIG. 9 may be arranged to be connected to the anti-peel-off structure 136 while being in contact with the microlenses (ML).

As is apparent from the above description, the image sensing device based on some implementations of the disclosed technology can prevent the lens capping layer from being easily peeled off, effectively preventing damage to the light shielding layer in an etching process of the lens capping layer.

The above embodiments are to be construed in all aspects as illustrative and not restrictive. Although a number of illustrative embodiments have been described, it should be understood that variations and modifications of those embodiments and other embodiments can be made based on what is described and/or illustrated in this patent document.

What is claimed is:

1. An image sensing device comprising:
a semiconductor substrate structured to include a pixel region, which includes a plurality of unit pixels, and a peripheral region located outside the pixel region;
a plurality of microlenses disposed over the semiconductor substrate in the pixel region;
a structural reinforcement layer disposed over the semiconductor substrate in the peripheral region; and
a lens capping layer structured to cover the microlenses and at least part of the structural reinforcement layer,
wherein the structural reinforcement layer includes:
a plurality of fingers each finger vertically structured to have a rounded upper end and laterally extend to have a predetermined length toward the pixel region, wherein the plurality of fingers is consecutively arranged and connected to each other in a lateral direction, and side surfaces of fingers are in contact with side surfaces of immediately adjacent fingers.

2. The image sensing device according to claim 1, wherein each of the fingers includes:
a body portion structured to be in contact with side surfaces of body portions of the immediately adjacent fingers; and
an edge portion formed to protrude from the body portion and have a rounded protruded portion.

3. The image sensing device according to claim 2, wherein the lens capping layer includes an edge located at the body portion.

4. The image sensing device according to claim 1, further comprising a plurality of extra microlenses disposed in the peripheral region between the structural reinforcement layer and the microlenses in the pixel region.

5. The image sensing device according to claim 4, wherein at least one of the extra microlenses is connected to the microlenses in the pixel region, and the extra microlenses are spaced apart from the structural reinforcement layer by a predetermined distance.

6. The image sensing device according to claim 4, wherein the extra microlenses are continuously arranged to be connected to the microlenses in the pixel region and the structural reinforcement layer.

7. The image sensing device according to claim 1, further comprising:
an over-coating layer located below the microlenses in the pixel region and the structural reinforcement layer.

8. The image sensing device according to claim 1, further comprising a light shielding layer structured to shield the semiconductor substrate in the peripheral region from light.

9. The image sensing device according to claim 1, wherein the structural reinforcement layer is formed in an annular shape surrounding the microlenses.

10. An image sensing device comprising:
a planarization layer formed over a lower structure including sensor pixels structured to detect incident light to output electrical signals indicative of an image of the incident light;

a plurality of microlenses disposed over the planarization layer to converge incident light onto the sensor pixels;

a structural reinforcement layer disposed over the planarization layer to surround the microlenses; and a lens capping layer disposed over the microlenses and the structural reinforcement layer, wherein the structural reinforcement layer includes a plurality of fingers, each of which has a body portion that has a curvature in a short-axis direction and extends to a predetermined length without a curvature in a long-axis direction perpendicular to the short-axis direction, wherein the plurality of fingers is consecutively arranged adjacent to each other.

11. The image sensing device according to claim 10, wherein:

the body portion of each finger is structured to vertically extend to a predetermined height, and includes a rounded upper end in the short-axis direction.

12. The image sensing device according to claim 10, wherein each of the fingers further includes an edge portion formed to protrude from the body portion in the long-axis direction such that side surfaces of the protruding portion are formed to have a curvature in the short-axis direction and the long-axis direction.

13. The image sensing device according to claim 10, wherein the lens capping layer includes an edge located at the body portion.

14. The image sensing device according to claim 10, wherein the microlenses are arranged in a manner that outermost microlenses from among the microlenses are spaced apart from the structural reinforcement layer by a predetermined distance.

15. The image sensing device according to claim 10, wherein the microlenses are arranged in a manner that outermost microlenses from among the microlenses are arranged to be connected to the structural reinforcement layer.

* * * * *